(12) United States Patent
Eaton et al.

(10) Patent No.: US 7,288,864 B2
(45) Date of Patent: Oct. 30, 2007

(54) SYSTEM AND METHOD FOR COOLING MOTORS OF A LITHOGRAPHIC TOOL

(75) Inventors: John K. Eaton, Stanford, CA (US); Andrew J. Hazelton, San Carlos, CA (US); Debjit Mukerji, El Segundo, CA (US)

(73) Assignee: Nikon Corporation, Tokyo (JP)

( * ) Notice: Subject to any disclaimer, the term of this patent is extended or adjusted under 35 U.S.C. 154(b) by 106 days.

(21) Appl. No.: 10/813,258

(22) Filed: Mar. 31, 2004

(65) Prior Publication Data

US 2005/0224222 A1    Oct. 13, 2005

(51) Int. Cl.
*H02K 9/00* (2006.01)
*H02K 9/19* (2006.01)

(52) U.S. Cl. .............................. 310/53; 310/12; 310/54

(58) Field of Classification Search ................... 310/12, 310/52–55, 58, 60 R, 66
See application file for complete search history.

(56) References Cited

U.S. PATENT DOCUMENTS

| | | |
|---|---|---|
| 3,517,730 A | 6/1970 | Wyatt |
| 3,559,422 A | 2/1971 | Holzer |
| 3,605,878 A | 9/1971 | Coleman |
| 3,637,007 A | 1/1972 | Shlosinger |
| 3,667,246 A | 6/1972 | Lorant et al. |
| 3,741,289 A | 6/1973 | Moore |
| 4,526,012 A | 7/1985 | Chigira |
| 4,573,525 A | 3/1986 | Boyd |
| 4,603,732 A | 8/1986 | Niggemann |
| 4,787,843 A | 11/1988 | Huffman |
| 4,898,231 A | 2/1990 | Miyazaki |
| 4,986,348 A | 1/1991 | Okayasu |
| 5,161,609 A | 11/1992 | Detertre et al. |
| 5,476,137 A | 12/1995 | Ochiai et al. |

(Continued)

FOREIGN PATENT DOCUMENTS

JP    3175332    7/1991

(Continued)

OTHER PUBLICATIONS

PCT Notification of Transmittal of the International Search Report and the Written Opinion of the International Searching Authority, or the Declaration, Jan. 27, 2005 corresponding to U.S. Appl. No. 10/455,004 (Publication No. 2004/0244963).

(Continued)

*Primary Examiner*—Burton Mullins
(74) *Attorney, Agent, or Firm*—Greenblum & Bernstein, P.L.C.

(57) ABSTRACT

A system and method of cooling motors of a lithographic tool. The system includes a temperature-adjusting device which adjusts the temperature of a heat transfer fluid to a boiling temperature that is substantially equal to the desired motor housing temperature. The system further includes a fixed or adjustable pressure device which adjusts the pressure of the heat transfer fluid to a predetermined level to maintain the boiling temperature. The boiling temperature remains substantially constant as the heat generated by the motor is absorbed by the heat transfer fluid. A pump pumps the heat transfer fluid through the temperature adjusting device, the pressure device and the motor. The system functions as a closed-looped system with the addition of a condenser/heat exchanger.

30 Claims, 8 Drawing Sheets

U.S. PATENT DOCUMENTS

| | | | |
|---|---|---|---|
| 5,535,818 | A | 7/1996 | Fujisaki et al. |
| 5,606,870 | A | 3/1997 | Lester |
| 5,770,899 | A | 6/1998 | Hayashi |
| 5,814,392 | A | 9/1998 | You et al. |
| 5,894,887 | A * | 4/1999 | Kelsey et al. ............. 165/80.2 |
| 5,911,272 | A | 6/1999 | Cornog et al. |
| 6,047,766 | A | 4/2000 | Van Brocklin et al. |
| 6,167,955 | B1 * | 1/2001 | Van Brocklin et al. ..... 165/272 |
| 6,229,116 | B1 | 5/2001 | Shirakawa et al. |
| 6,241,402 | B1 | 6/2001 | Sakamoto et al. |
| 6,312,171 | B1 | 11/2001 | Matsuyama et al. |
| 6,332,723 | B1 | 12/2001 | Matsuyama et al. |
| 6,468,681 | B1 | 10/2002 | Horiguchi |
| 6,574,963 | B1 * | 6/2003 | Tadayon et al. ............. 60/651 |
| 6,684,941 | B1 | 2/2004 | Cao et al. |
| 6,946,755 | B2 * | 9/2005 | Tamai et al. ................. 310/12 |
| 2001/0015171 | A1 | 8/2001 | Ooshima |
| 2004/0244963 | A1 | 12/2004 | Hazelton |
| 2005/0040712 | A1 * | 2/2005 | Hazelton .................... 310/12 |

FOREIGN PATENT DOCUMENTS

| | | |
|---|---|---|
| JP | 5315293 | 11/1993 |
| JP | 1 0141789 | 5/1998 |
| JP | 6 3306395 | 12/1999 |

OTHER PUBLICATIONS

J.R. Maldonado et al., "X-ray Lithography Source Using a Stationary Pd Target." J. Vac. Sci. Technol. 16(6) Nov./Dec., pp. 1942-1945.

Chapter 6.5, Variable Conductable Heat Pipers (pp. 215-218) from: Peterson, George O. *An Introduction to Heat Pipes: Modeling, Testing, and Applications*. ISBM 0-471-30512-X, TJ264.P48 1994, 621.402'5-dc20.

* cited by examiner

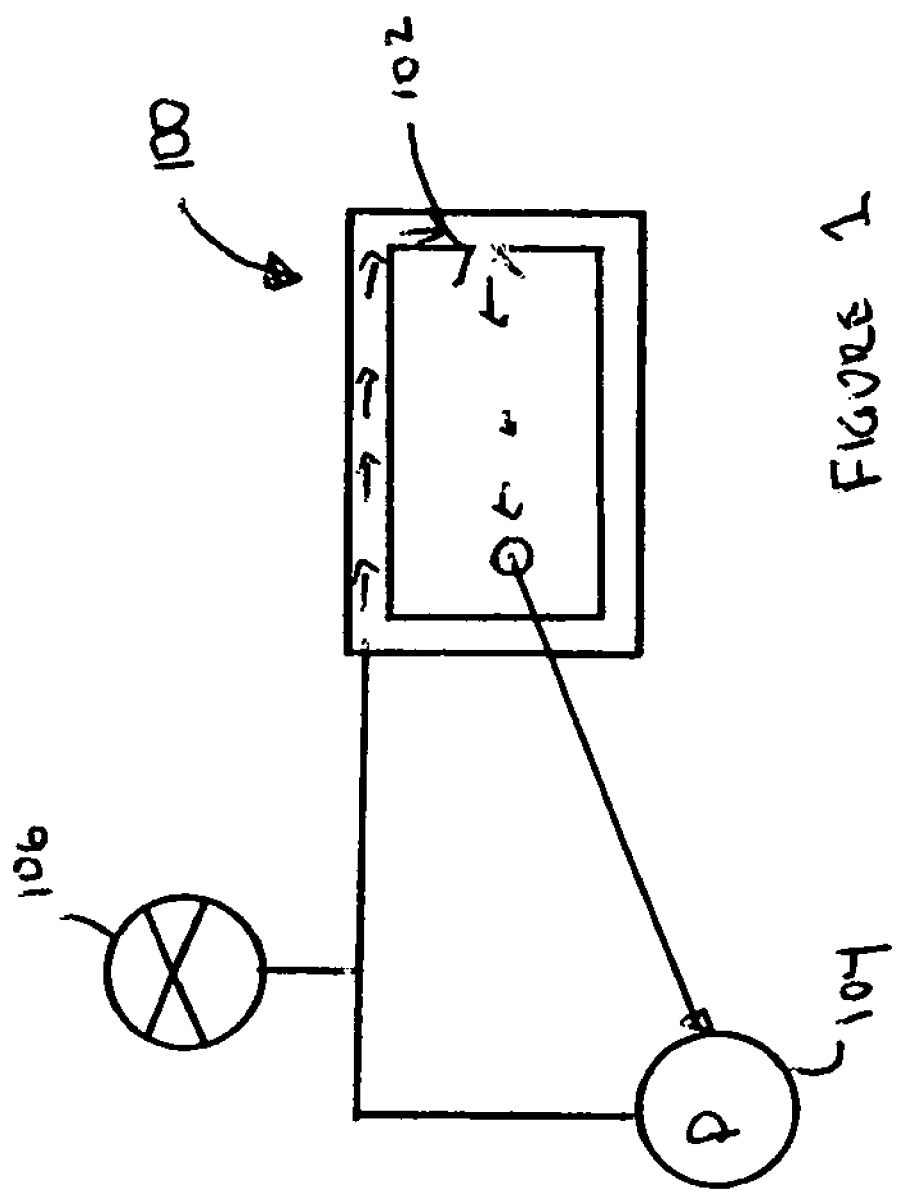

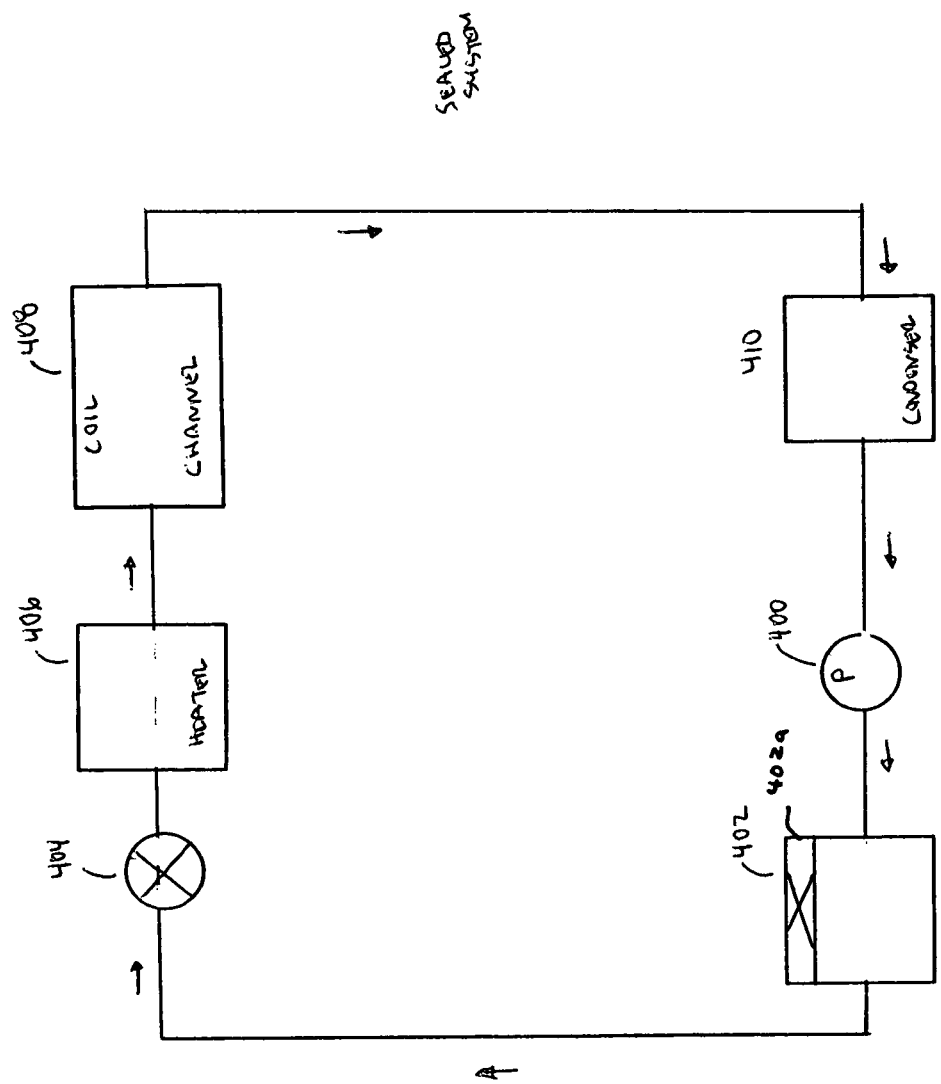

SYSTEM AND METHOD FOR COOLING MOTORS OF A LITHOGRAPHIC TOOL

BACKGROUND OF THE INVENTION

1. Field of the Invention

The present invention relates generally to a system and method for cooling motors and more specifically to a system and method for cooling linear motors of a lithographic tool or device.

2. Background Description

An exposure apparatus utilizes one or more linear motors to precisely position a wafer stage which holds a semiconductor wafer relative to a reticle. The images transferred onto the wafer from the reticle are extremely small, and precise positioning of the wafer and the reticle is thus critical to the manufacturing of the wafer. To maintain precise control of the positioning of the wafer and reticle, a measuring system is utilized such as a laser interferometer in combination with a wafer stage mirror. The laser interferometer, which is known to be sensitive to air temperature variations, preferably has a wavelength of approximately 630 nm (i.e., red helium-neon laser).

Several types of linear motors are known to be used with exposure apparatus such as lithographic tools. In a typical linear motor, a magnet array encircles a coil array. The coil array includes a plurality of coils that are individually supplied with an electrical current. The electrical current generates an electromagnetic field that interacts with the magnetic field of the magnet array thus causing the coil array to move relative to the magnet array. When the magnet array is secured to the wafer stage, the wafer stage moves in concert with the magnet array. In this manner, precise movement of the wafer stage can be accomplished in several planes using several linear motors.

In providing an electrical current to the coils, however, heat is generated due to the resistance in the coils. The heat generation rate increases as the linear motor acceleration increases due to increased current requirements. The heat generated from the coils is subsequently transferred to the surrounding environment, including the air surrounding the linear motor and the other components positioned near the motor.

Several problems occur due to the heat generation in the linear motors. By way of a first example, the heat expands components of the lithographic machine, thus causing alignment problems and degrading the accuracy of the device. Additionally, the heat changes the index of refraction of the surrounding air which reduces the accuracy of the metrology system and degrades machine positioning accuracy. Specifically, the heat generated by the coils of the motor raises the air temperature around the motor which changes the index of refraction along the interferometer beam path. This causes noise and error in the interferometer signal. Moreover, the resistance of the coils increases as temperature increases which, in turn, exacerbates the heating problem and reduces the performance and life of the linear motor.

There is a requirement, then, to maintain the outer surface temperature of the linear motor housing at a very uniform temperature. That surface temperature must be matched closely to the surrounding air in the exposure apparatus. A typical specification is that the linear motor surface temperature be maintained within 0.1 C of the surrounding air temperature. Known systems have linear motors which operate at low power, and thus low speed, to minimize heat generation. However, whenever any current is supplied to the motor, heat is generated. That heat must be removed by conduction to the exposure apparatus frame and convection to the surrounding air. Heat removal by either conduction or convection requires that the motor surface be at higher temperature than the surroundings. Therefore, unless the motor is operated at extremely low power, its surface temperature will exceed the specification. Such a low-power motor cannot meet the other specifications for speed and acceleration.

In one solution, coolant such as the Novec series of coolants (manufactured by 3M) is used to cool the coils of the linear motor. The coolant flows through a close-fitting container around the coils carrying away the heat generated by the coils. There are two problems with this approach. First, as the industry builds faster stages, more coolant is required to absorb the heat generated by the coils. Secondly, the heat transferred to the coolant raises the coolant temperature. The temperature is higher on the outlet side of the coil container as compared to the inlet side. Such temperature non-uniformities cause the metrology problems discussed above. The physical properties of the coolant limit the amount of heat that can be absorbed for a given temperature rise. Specifically, the product of the coolant density and the coolant specific heat (the $\rho c_p$ product) determines the coolant temperature rise for a given flowrate of coolant and heat dissipation in the coils. This $\rho c_p$ product can be expressed in units of Watts/LPM–° K, where LPM is liter per minute. For example, one coolant may have a $\rho c_p$ product of 30 Watts/LPM–° K. This means that for a coil power dissipation of 30 Watts and a coolant flow rate of 1 LPM, the coolant temperature rise will be 1° K. To decrease the temperature rise the coil power must be reduced or the coolant flow rate increased.

As can thus be seen, the $\rho c_p$ product dictates the amount of coolant that must pass through the linear motor in order to remove the heat generated by the coils with an acceptable temperature rise. For example, as the coolant enters the coils at a controlled temperature, heat from the coils will raise the temperature of the coolant. As the coolant then leaves the linear motor, it will have a higher temperature. But, if the temperature rises too much, it will be necessary to pump more coolant through the linear motor to cool the coils of the motor. This requires a stronger pump, larger flow rates, additional energy needed for the system, large piping and additional flow-inducted vibration. If not enough coolant passes by the motor to carry away the heat, then the problems discussed above will result.

SUMMARY OF THE INVENTION

In a first aspect of the present invention, a system for cooling a motor includes a temperature-adjusting device which adjusts the temperature of a heat transfer fluid to be within a small tolerance of the desired temperature of the linear motor housing. The system further includes a pressure device which adjusts a pressure of the heat transfer fluid to the thermodynamic saturation pressure corresponding to the set temperature. This means that boiling of the heat transfer fluid will occur when heat is transferred from the motor coils to the fluid. When boiling is occurring, the temperature and pressure of the heat transfer fluid are not thermodynamically independent. Therefore, the boiling temperature remains substantially constant as the heat generated by the motor is absorbed by the heat transfer fluid. A pump pumps the heat transfer fluid through the temperature adjusting device, the pressure device and the motor.

In another aspect of the invention, a thermoelectric device adjusts the temperature of a coolant to the boiling temperature of the coolant. An adjustable pressure-regulating device adjusts the pressure of the heat transfer fluid to a predetermined pressure that sets the desired boiling temperature. A feedback control unit adjusts the temperature of the coolant via the thermoelectric device such that a $T_{desired}$ temperature is substantially equal to a $T_{in}$ temperature. The feedback control also adjusts the pressure of the coolant via the adjustable pressure-regulating device such that the boiling temperature of the coolant is maintained at a $T_{out}$ temperature which is substantially equal to the $T_{desired}$ temperature. A pump pumps the coolant through the thermoelectric device, adjustable pressure regulating device and the linear motor. The adjustable pressure-regulating device maintains the boiling temperature of the coolant as heat generated by the linear motor is absorbed by the coolant.

In yet another aspect of the invention, a method is provided for cooling a motor. The method includes the steps of adjusting the temperature of a heat transfer fluid to approximately a boiling temperature and adjusting the pressure of the heat transfer fluid to maintain the boiling temperature of the heat transfer fluid at a predetermined level. The boiling temperature remains substantially constant as heat is absorbed by the heat transfer fluid generated by the motor. The method further includes pumping the heat transfer fluid through the motor at the adjusted temperature and predetermined pressure.

In a further aspect of the invention, an exposure apparatus is provided. The exposure apparatus includes an illumination system that projects radiant energy through a mask pattern on a reticle R that is supported by and scanned using a wafer positioning stage. At least one linear motor is provided that positions the wafer positioning stage. A system cools at least one linear motor. The system includes a temperature adjusting device which adjusts the temperature of a coolant to approximately the desired temperature and a pressure device that adjusts the pressure of the coolant to maintain the boiling temperature at a predetermined level. This maintains the boiling temperature as heat is absorbed by the coolant from at least one linear motor. A pump pumps the coolant through the temperature adjusting device, the pressure device and at least one linear motor. A device may be manufactured using the exposure apparatus. Also, a wafer on which an image has been formed by the exposure apparatus is also provided.

BRIEF DESCRIPTION OF THE DRAWINGS

The foregoing and other objects, aspects, and advantages will be better understood from the following detailed description of a preferred embodiment of the invention with reference to the drawings, in which:

FIG. 1 is a representative schematic of a fixed pressure drop system of the present invention;

FIG. 3 shows an aspect of the present invention using an adjustable valve in a sealed system;

DETAILED DESCRIPTION OF EMBODIMENTS OF THE INVENTION

Figure 2A:
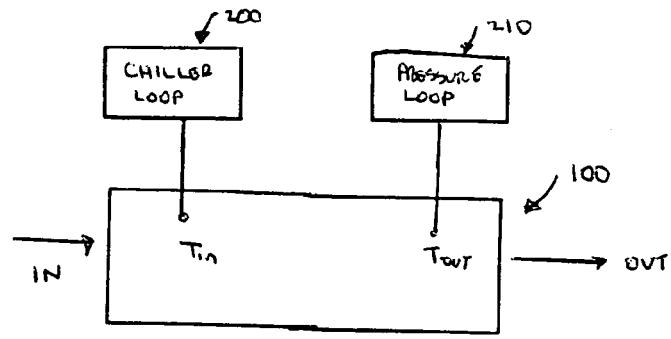
FIGS. 2a–2c show a feedback control system implemented by the present invention.

The present invention is directed to a system and method for cooling linear motors of a lithographic tool. By use of the present invention, it is now possible to maintain an outer surface of a linear motor within a set temperature range to control the effect of the linear motor on the surrounding environment and the surrounding components. The present invention is based on the principles of a two-phase system which maintains the coolant at a specific boiling temperature by adjusting the pressure and temperature of the coolant as it enters the linear motor. In this system and method, the boiling temperature of the coolant will remain substantially the same as a desired temperature prior to flowing into the linear motor. By monitoring the coolant temperature as the coolant enters and exits the motor, it can be determined that the heat from the source, i.e., coils, has boiled part or all of the coolant while maintaining a nearly constant temperature of the linear motor. This boiling absorbs heat, but with almost no temperature rise of the coolant. Small variations in the boiling temperature may occur due to the pressure drop of the coolant flowing through the motor housing. In this manner, the precision and accuracy of the tool will be maintained. In embodiments, the coolant is designed to boil at an ambient temperature of approximately 23° C.

Embodiments of the Present Invention

Referring now to FIG. 1, a schematic of a fixed pressure drop system of the present invention is shown. In this aspect of the invention, the pressure of the coolant is controlled within the linear motor 100 using a fixed pressure drop device 102. The linear motor 100 is a typical linear motor having a magnet array surrounding the coil array. But, the present invention, in all aspects, may equally be used with other types of motors. The pressure drop device 102 may be a venturi or may be any type of restrictor, for example, an orifice or a needle valve. In this system, once the pressure drop is adjusted, it is fixed for the linear motor 100.

As further seen in FIG. 1, a pump 104 and an atmospheric vent 106 are also provided. The pump 104 may include a chiller or other thermoelectric device for adjusting the temperature of the heat transfer fluid, i.e., coolant. The coolant may be vented to atmosphere via the atmospheric vent 106. Thus, according to the embodiment of FIG. 1, the present invention is a cooling system for a linear motor that includes a temperature-controlled coolant and a fixed pressure drop to control the boiling point of the coolant. "Boiling point" encompasses temperature and pressure.

It should be understood by those of ordinary skill in the art that the boiling temperature of the coolant is a function of pressure. Thus, by lowering the pressure of the coolant, the boiling temperature of the coolant will also be lowered according to known principles of thermodynamics. Likewise, raising the pressure of the coolant will also raise the boiling temperature of the coolant. It should also now be understood that the temperature of the coolant will not change as heat is transferred from the motor as long as the coolant is maintained in the two-phase state. Thus, heat generated from the motor coils will result in the boiling of the coolant, but will not raise the temperature of the coolant. All of coolant typically will not be vaporized. Thus, by using the present invention, regulating the temperature and pressure of the coolant as it enters the linear motor will ensure that the temperature of the linear motor will not rise thus ensuring the accuracy of the lithographic tool. The coils may include a surface that is slightly roughened by sanding or scratching the surface to produce more uniform and vigorous boiling.

Figure 2B:
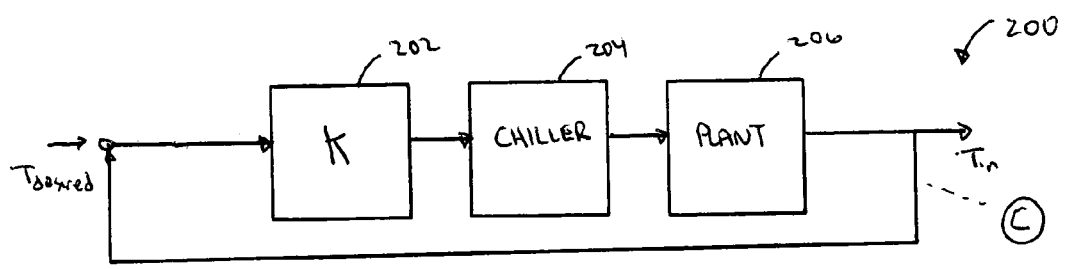
Figure 2C:
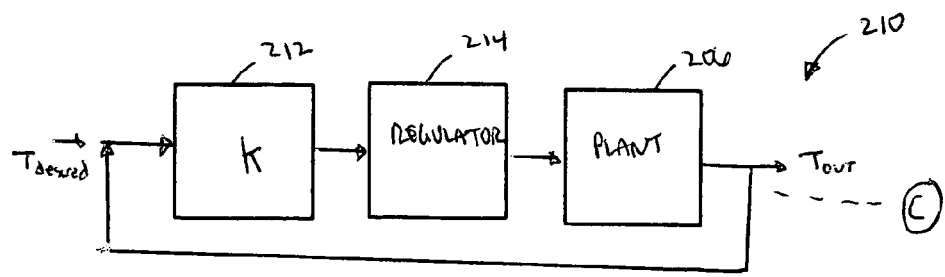

FIGS. 2a–2c show a feedback control system implemented by the present invention. In this implementation, the pressure of the coolant is controlled using an adjustable valve or some other mechanism for actively changing the coolant pressure in the linear motor. FIG. 2a is a highly schematic representation of the control system implemented by the present invention. In this representation, a chiller or other thermoelectric device loop 200 and a pressure loop 210 is shown controlling the temperature and pressure variables, respectively, of the coolant. By using this looped control, the temperature entering and exiting the linear motor may be maintained at a nearly constant temperature thus enabling the heat transfer fluid to better absorb heat generated from the linear motor and thereby maintain the temperature of the linear motor. In this manner, there will be minimum temperature increase of the linear motor surface, thus maintaining the accuracy of the tool.

In FIG. 2b, a temperature control feedback loop 200 is used to maintain the inlet temperature of the heat transfer fluid at the desired temperature. None of the heat transfer fluid is boiling at this point. Specifically, the control loop of FIG. 2a includes a $T_{desired}$ temperature of the heat transfer fluid entering into the system. A feedback control 202 is representative of a gain control which monitors and is capable of adjusting the temperature of the heat transfer fluid via a chiller or thermoelectric device 204. Any control law known in the art such as a proportional-integral-derivative (PID) controller or lead lag filter may be used. The plant 206, i.e., motors, pumps, and other heat source of the lithographic tool, is provided with the desired or predetermined temperature of the heat transfer fluid. The $T_{in}$ temperature should be, in embodiments, equivalent to the $T_{desired}$ temperature.

FIG. 2c shows a pressure control loop 210 implemented by the present invention. In this control loop, the pressure feedback control device 212 is used to monitor and adjust the pressure of the heat transfer fluid such that the boiling temperature of the heat transfer fluid is at the $T_{desired}$ temperature. In the embodiment shown in FIG. 2c, the $T_{out}$ temperature of the heat transfer fluid is measured. Since the boiling heat transfer fluid will be at a nearly constant temperature, the $T_{out}$ temperature is indicative of the boiling point of the heat transfer fluid. Thus, by changing the pressure of the heat transfer fluid, in the plant 206, using an adjustable pressure regulator, valve or some other restrictor 214 the boiling temperature of the heat transfer fluid changes, thus changing the $T_{out}$ temperature. Now, by comparing the $T_{out}$ temperature to the $T_{desired}$ temperature and the $T_{desired}$ temperature to the $T_{in}$ temperature via a controller C, it can be determined that there is no substantial temperature change of the heat transfer fluid and that hence boiling occurred. That is, the system of the present invention thus provides a temperature control and an adjustable pressure drop to control the boiling point of the coolant.

Figure 4:
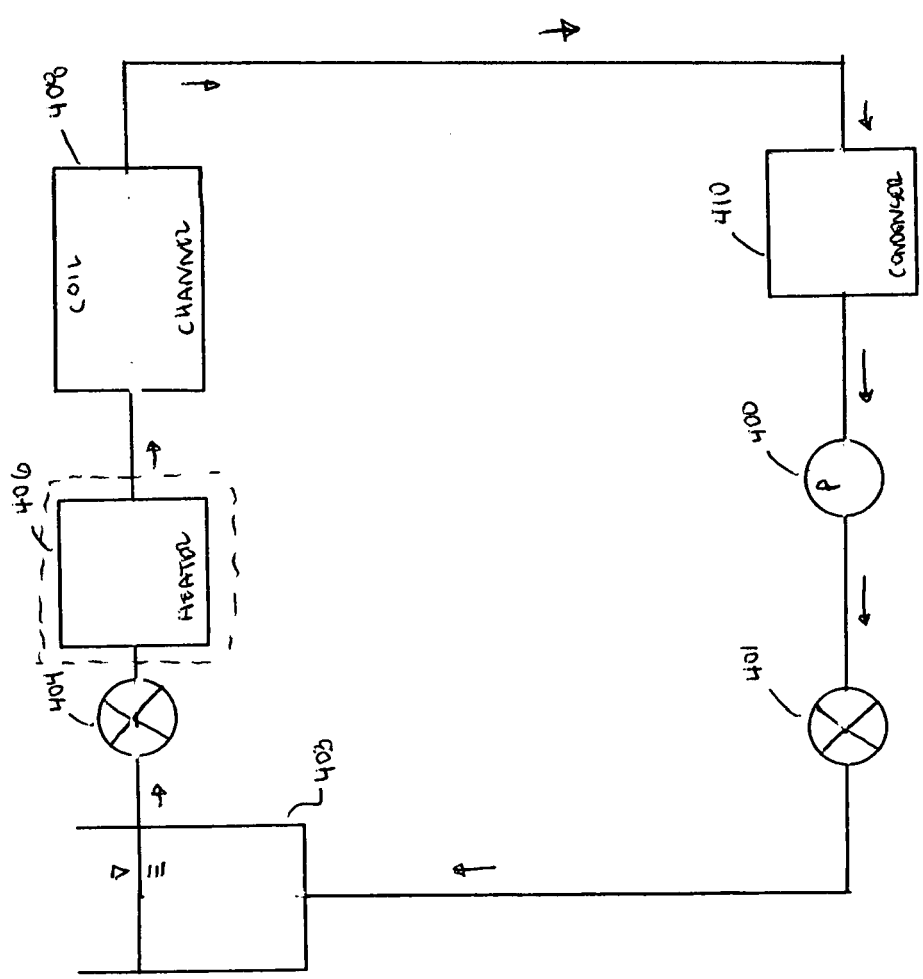
FIG. 4 shows an aspect of the present invention using an adjustable valve in a vented system at atmospheric pressure.
Figure 5:
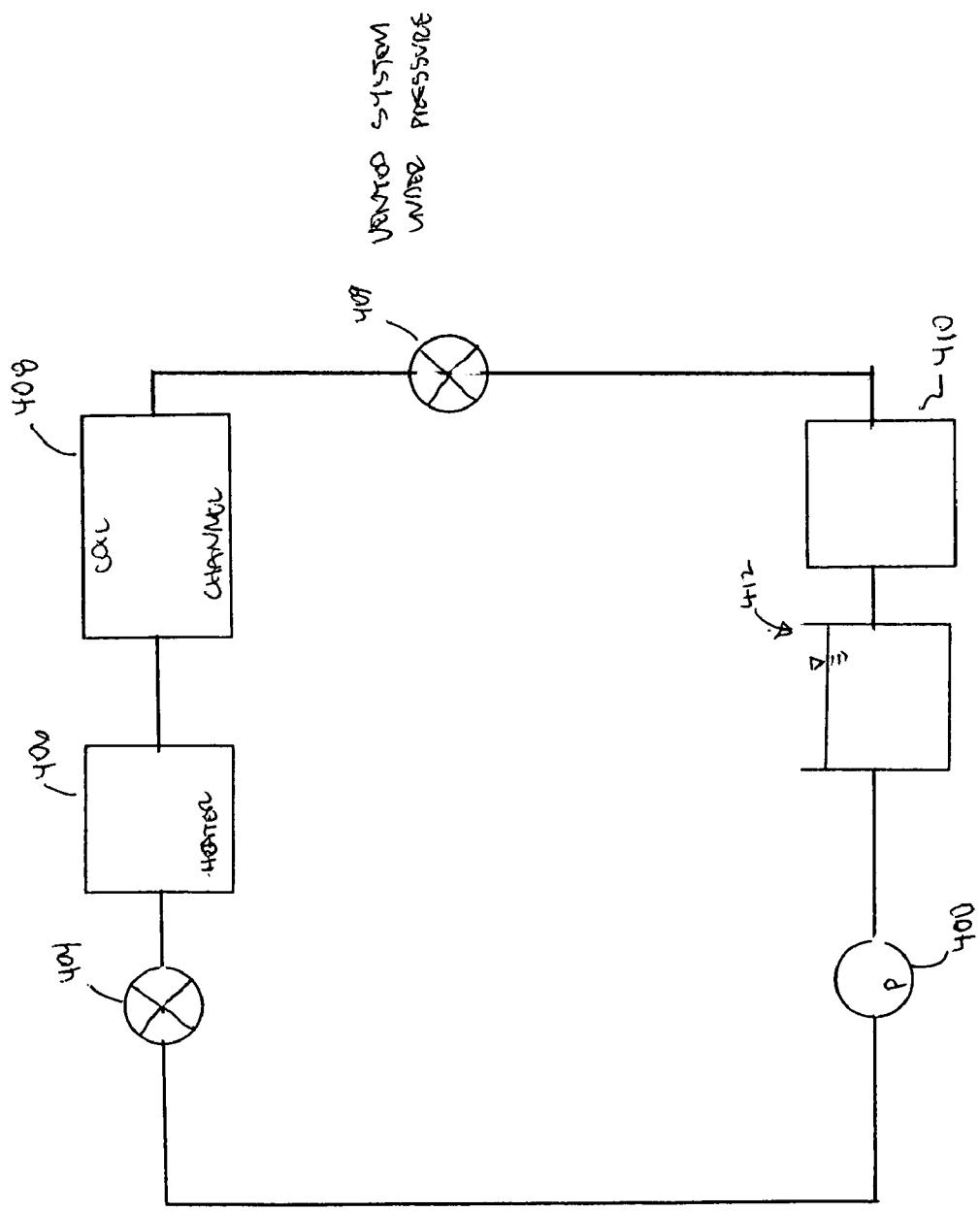
FIG. 5 shows an aspect of the present invention using an adjustable valve in a vented system under pressure.

FIGS. 3–5 show aspects of the present invention using an adjustable valve system. In these aspects of the invention, the pressure and temperature of the coolant are controlled in a boiling heat transfer system. In FIGS. 3 and 4, the heat transfer fluid, i.e., coolant, is SUVA-123 from DuPont, which has a boiling temperature of 23° C. at absolute pressure of 85 kPa (partial vacuum). Thus, the boiling temperature at atmospheric pressure is above room temperature. It should be understood, though, that the systems of the present invention equally contemplate the use of other coolants within the scope of the present invention, and that the use of SUVA-123 is provided herein for exemplary purposes. Additionally, it is within the scope of the invention to utilize the feedback controls shown in FIGS. 2a–2c in controlling, monitoring and/or adjusting the variables of the coolant in the aspects of the invention of FIGS. 3–5.

FIG. 3 shows a completely sealed system using an adjustable valve. The sealed system ensures that the fluid does not boil off into the atmosphere and prevents air from leaking in since in this embodiment the system pressure is below atmosphere pressure. Additionally, in this configuration the system should be accurately charged (air must be removed from the system). In the system of FIG. 3, a pump 400 is used to raise the heat transfer fluid pressure to higher than atmospheric. The pressurized heat transfer fluid collects in the accumulator 402 and the attached valve 402a drops the pressure as it flows into the system. The fluid then passes through an actively controlled adjustable valve 404 used to adjust (e.g., drop) the pressure of the heat transfer fluid in order to control the boiling temperature of the heat transfer fluid in the linear motor 408. A heater or chiller 406 (or other type of thermal device), any configuration of which is well known in the industry, is used to adjust (raise or lower) the temperature of the heat transfer fluid to very close to the desired temperature. The heat transfer fluid then flows through the linear motor 408 at which time heat is removed from the coil 408a by boiling of the heat transfer fluid. The linear motor 408, much like the linear motors discussed throughout, can be any known type of linear motor, and may be used for moving a wafer stage in any desired plane. The heat transfer fluid then returns to a condenser 410, where heat from the boiled fluid is released, converting the boiled gas to liquid. The heat transfer fluid then condenses to a liquid and enters the pump 400 again.

It should be understood that the position of the adjustable valve 404 and the thermal device 406 are interchangeable. Also, the position of the pump 400 and the condenser 410 are also interchangeable; however, it is preferred that the pump is positioned after the condenser so that only liquid is pumped though the pump 400. Moreover, it is contemplated by the present invention that approximately 1% to 2% by mass of the heat transfer fluid is vaporized in the linear motor 408, much like in all of the aspects of the present invention. Of course, depending on the configuration, more or less heat transfer fluid may flow through the motor at a single point in time.

In an embodiment of the present invention, the heat transfer fluid is SUVA 123 and the boiling temperature is related to the pressure by the approximate equation $T_{boil}$=23° C.+0.303° C./kPa (P-84.8 kPa), where P is the fluid saturation pressure measured in kilopascals (kPA). The fraction of the liquid that will be turned to vapor in the motor is determined by the power dissipated in the motor, the coolant flowrate and the properties of the coolant. For example, using the heat transfer fluid SUVA 123 at an operating point near 23° C., the percentage of the coolant turned to vapor in the motor housing is:

% vaporized=0.023 Power/LPM where the power dissipated is measured in Watts and the flowrate (LPM) is liters per minute. For example, for a motor generating 100 Watts with a coolant flowrate of 2 LPM, the percentage (by mass) of vapor in the coolant at the motor exit is 0.023×100/2=1.15%. Of course, this same principle is applicable for other temperatures and pressures and power dissipations.

In the system of FIG. 4, a pump 400 is again used to raise the heat transfer fluid pressure. A coarse valve 401 is, in embodiments, used to drop the pressure to atmospheric into a reservoir 403 vented to atmosphere. The reservoir 403 may contain a heater or other temperature-adjusting device (such as a chiller) to precisely control the temperature of the heat transfer fluid flowing to the linear motor 408. The heat transfer fluid then flows through an actively controlled adjustable valve 404 to drop the pressure and control the boiling point of the heat transfer fluid. In embodiments, the heat transfer fluid may flow through a chiller or other thermoelectric device 406 prior to flowing into the linear motor 408 (if one is not provided in the reservoir 403). The fluid flows through the linear motor 408 and removes heat by partially boiling, as provided in all aspects of the invention. The heat is then removed in a condenser 410, converting the vapor to liquid. The fluid then enters the pump 400. Again, it is noted that the position of the valve 404 and the chiller 406 and the pump 400 and the condenser 410, respectively, are interchangeable as discussed above.

FIG. 5 shows a vented system under pressure, one embodiment of the present invention. In this configuration, the heat transfer fluid boiling temperature is below room temperature at atmospheric pressure. This heat transfer fluid (coolant) may be, for example, HFC 236-PA from DuPont. Once again, the pump 400 is used to raise the pressure of the heat transfer fluid. The valve 404 is used to drop the pressure such that the heat transfer fluid will boil at the desired temperature. The fluid then flows through a heater or other thermoelectric device 406 to precisely set the motor inlet temperature. The heat transfer fluid then flows through the linear motor 408 and removes heat from the coils of the motor by boiling. The heat transfer fluid then flows through a valve 409 which drops the pressure back to just above atmospheric. There will be a small pressure drop in the condenser. The gas in the heat transfer fluid is returned to the liquid state in the condenser 410, then returned to a vented reservoir 412 at atmospheric pressure. Again, it is noted that the position of the valve 404 and the chiller 406 and the pump 400 and the condenser 410, respectively, and other features are interchangeable. Obviously, combinations of these aspects of the invention of FIGS. 3–5 are within the scope of this invention.

Figure 6:
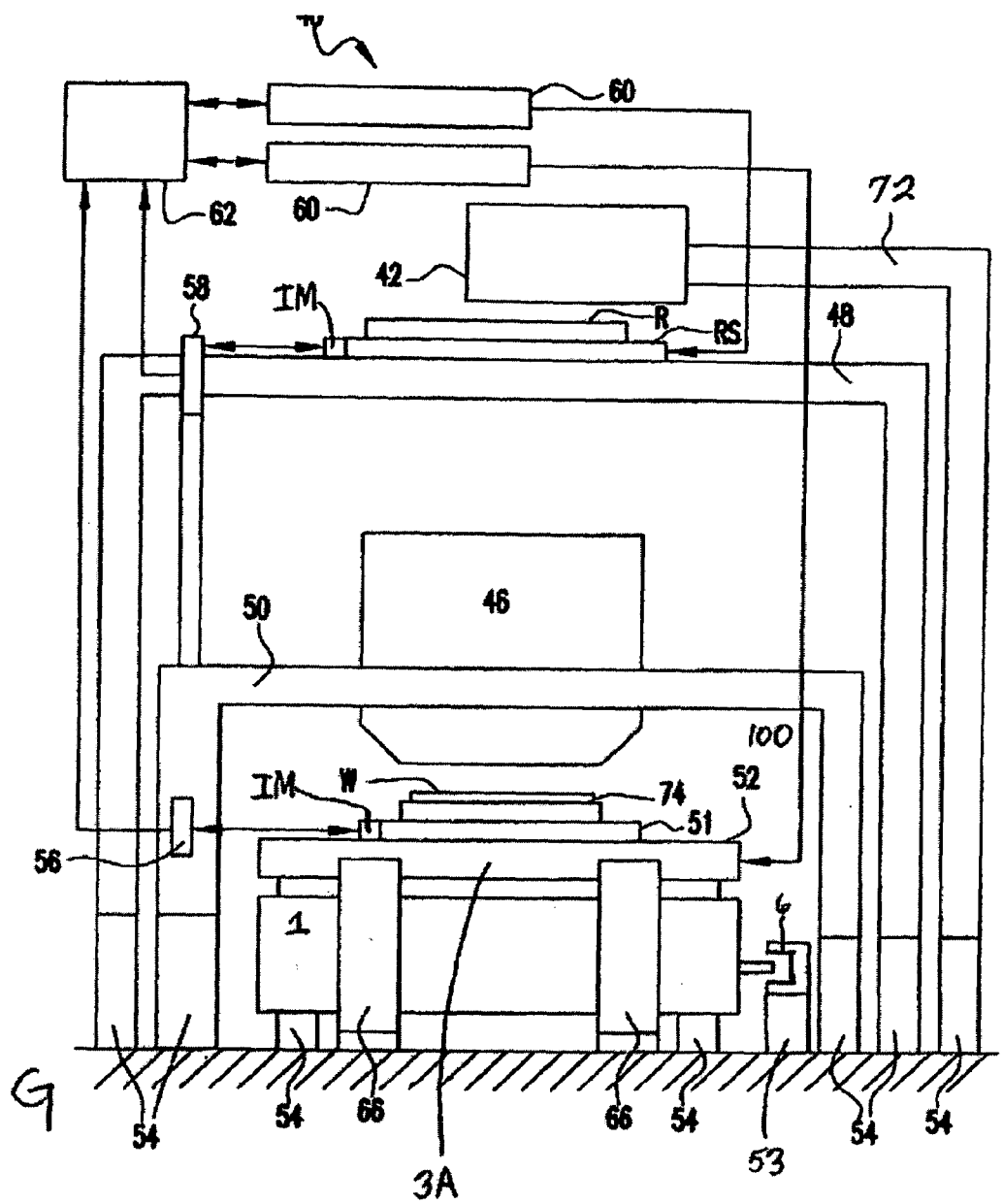
FIG. 6 is a schematic view illustrating a photolithography apparatus according to the invention.

FIG. 6 is a schematic view illustrating a photolithography apparatus (exposure apparatus) 40 in accordance with the present invention. The wafer positioning stage 52 includes a wafer stage 51, a base 1, a following stage 3A, a following stage base 3A, and an additional actuator 6. The wafer stage 51 comprises a wafer chuck 120 that holds a wafer 130 and an interferometer mirror IM. The base 1 is supported by a plurality of isolators 54 (or a reaction frame). The isolator 54 may include a gimbal air bearing 105. The following stage base 3A is supported by a wafer stage frame (reaction frame) 66. The additional actuator 6 is supported on the ground G through a reaction frame 53. The wafer positioning stage 52 is structured so that it can move the wafer stage 51 in multiple (e.g., three to six) degrees of freedom under precision control by a drive control unit 140 and system controller 30, and position and orient the wafer 130 as desired relative to the projection optics 46. In this embodiment, the wafer stage 51 has six degrees of freedom by utilizing the Z direction forces generated by the x motor and the y motor of the wafer positioning stage 52 to control a leveling of the wafer 130. However, a wafer table having three degrees of freedom (Z, θx, θy) or six degrees of freedom can be attached to the wafer stage 51 to control the leveling of the wafer. The wafer table includes the wafer chuck 120, at least three voice coil motors (not shown), and bearing system. The wafer table is levitated in the vertical plane by the voice coil motors and supported on the wafer stage 51 by the bearing system so that the wafer table can move relative to the wafer stage 51.

The reaction force generated by the wafer stage 51 motion in the X direction can be canceled by motion of the base 1 and the additional actuator 6. Further, the reaction force generated by the wafer stage motion in the Y direction can be canceled by the motion of the following stage base 3A.

An illumination system 42 is supported by a frame 72. The illumination system 42 projects radiant energy (e.g., light) through a mask pattern on a reticle R that is supported by and scanned using a reticle stage RS. In one embodiment, the reticle stage RS may have a reticle coarse stage for coarse motion and a reticle fine stage for fine motion. In this case, the reticle coarse stage correspond to the translation stage table 100, with one degree of freedom. The reaction force generated by the motion of the reticle stage RS can be mechanically released to the ground through a reticle stage frame 48 and the isolator 54, in accordance with the structures described in JP Hei 8-330224 and U.S. Pat. No. 5,874,820, the entire contents of which are incorporated by reference herein. The light is focused through a projection optical system (lens assembly) 46 supported on a projection optics frame 75 and released to the ground through isolator 54.

An interferometer 56 is supported on the projection optics frame 75 and detects the position of the wafer stage 51 and outputs the information of the position of the wafer stage 51 to the system controller 30. A second interferometer 58 is supported on the projection optics frame 75 and detects the position of the reticle stage RS and outputs the information of the position to the system controller 30. The system controller 30 controls a drive control unit 140 to position the reticle R at a desired position and orientation relative to the wafer 130 or the projection optics 46. By using the system and method of the present invention, accuracy of the interferometer is maintained.

There are a number of different types of photolithographic devices. For example, apparatus 70 may comprise an exposure apparatus that can be used as a scanning type photolithography system, which exposes the pattern from reticle R onto wafer 130 with reticle R and wafer 130 moving synchronously. In a scanning type lithographic device, reticle R is moved perpendicular to an optical axis of projection optics 46 by reticle stage RS and wafer 130 is moved perpendicular to an optical axis of projection optics 46 by wafer positioning stage 52. Scanning of reticle R and wafer 130 occurs while reticle R and wafer 130 are moving synchronously but in opposite directions along mutually parallel axes parallel to the x-axis.

Alternatively, exposure apparatus 70 can be a step-and-repeat type photolithography system that exposes reticle R while reticle R and wafer 130 are stationary. In the step and repeat process, wafer 130 is in a fixed position relative to reticle R and projection optics 46 during the exposure of an individual field. Subsequently, between consecutive exposure steps, wafer 130 is consecutively moved by wafer positioning stage 52 perpendicular to the optical axis of projection optics 46 so that the next field of semiconductor wafer 130 is brought into position relative to projection optics 46 and reticle R for exposure. Following this process, the images on reticle R are sequentially exposed onto the fields of wafer 130 so that the next field of semiconductor wafer 130 is brought into position relative to projection optics 46 and reticle R.

However, the use of apparatus 70 provided herein is not limited to a photolithography system for semiconductor manufacturing. Apparatus 70 (e.g., an exposure apparatus), for example can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

In the illumination system 42, the illumination source can be g-line (436 nm), i-line (365 nm), KrF excimer laser (248 nm), ArF excimer laser (193 nm) or $F_2$ laser (157 nm). Alternatively, the illumination source can also use charged particle beams such as x-rays and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to projection optics 46, when far ultra-violet rays such as the excimer laser is used, glass materials such as quartz and fluorite that transmit far ultra-violet rays are preferably used. When the $F_2$ type laser or x-rays are used, projection optics 46 should preferably be either catadioptric or refractive (a reticle should also preferably be a reflective type), and when an electron beam is used, electron optics should preferably comprise electron lenses and deflectors. The optical path for the electron beams should be traced in vacuum.

Also, with an exposure device that employs vacuum ultra-violet radiation (VUV) of wavelength 200 nm or shorter, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japanese Patent Application Disclosure No. 10-20195 and its counterpart U.S. Pat. No. 5,835,275. In these cases, the reflecting optical device can be a catadioptric optical system incorporating a beam splitter and concave mirror. Japanese Patent Application Disclosure No. 8-334695 published in the Official Gazette for Laid-Open Patent Applications and its counterpart U.S. Pat. No. 5,689,377 as well as Japanese Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above-mentioned U.S. patents, as well as the Japanese patent applications published in the Office Gazette for Laid-Open Patent Applications are incorporated herein by reference.

Further, in photolithography systems, when linear motors that differ from the motors shown in the above embodiments (see U.S. Pat. Nos. 5,623,853 or 5,528,118) are used in one of a wafer stage or a reticle stage, the linear motors can be either an air levitation type employing air bearings or a magnetic levitation type using Lorentz force or reactance force. Additionally, the stage could move along a guide, or it could be a guideless type stage that uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 7:
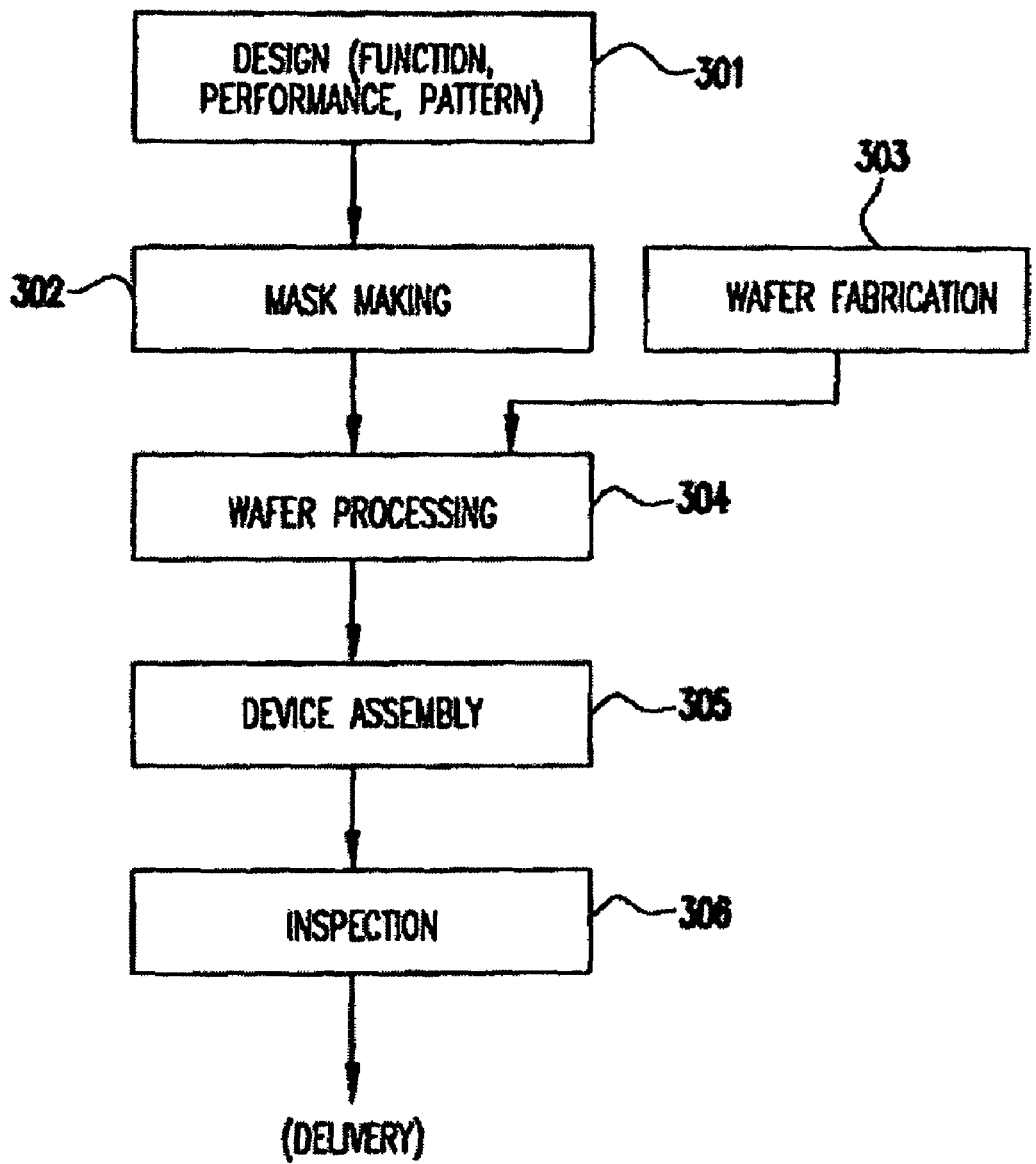
FIG. 7 is a flow chart showing semiconductor device fabrication.

Further, semiconductor devices can be fabricated using the above described systems, by the process shown generally in FIG. 7. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 8:
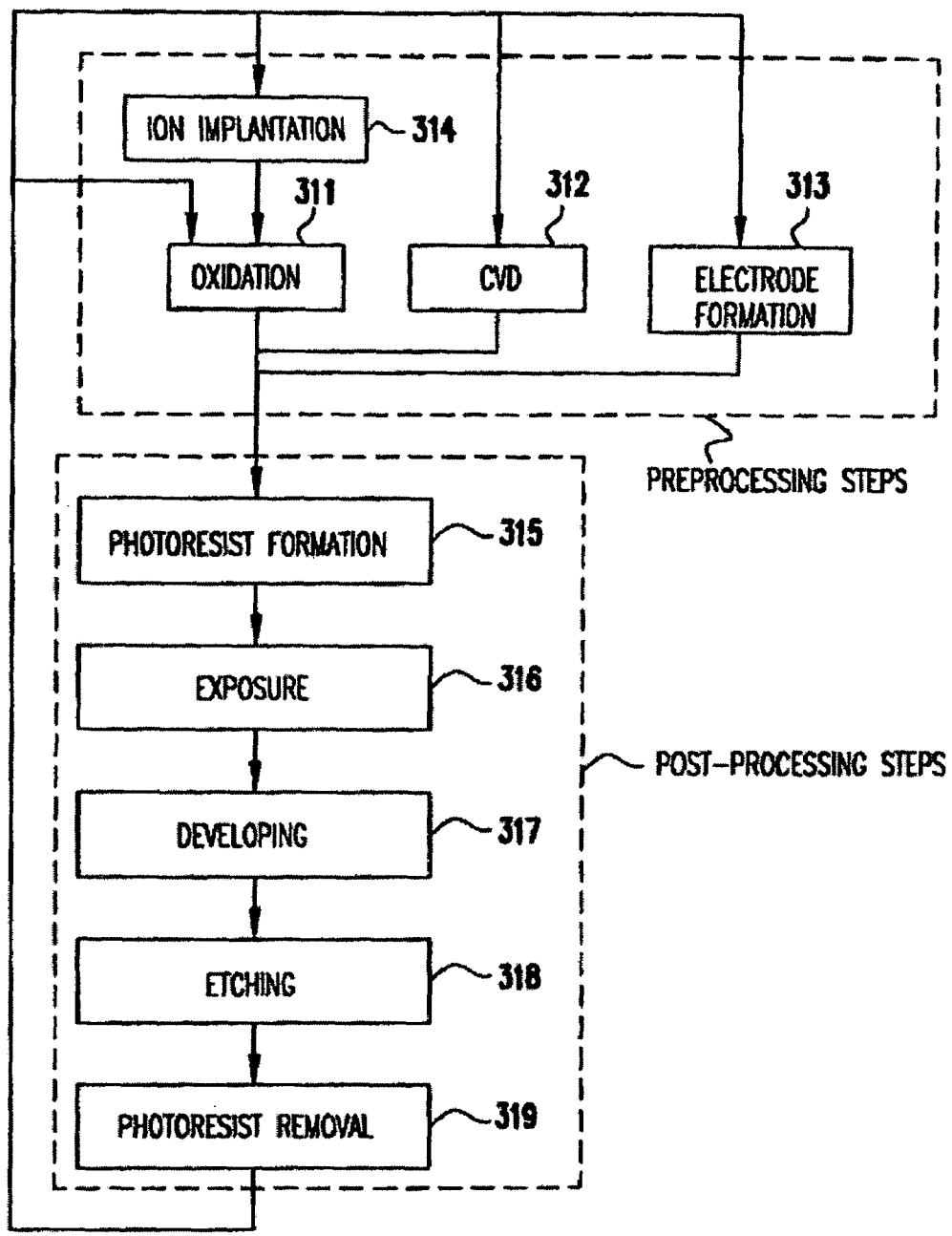
FIG. 8 is a flow chart showing wafer processing.

FIG. 8 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above-mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially in step 315 (photoresist formation step), photoresist is applied to a wafer. Next, in step 316 (exposure step), the above-mentioned exposure apparatus is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these pre-processing and post-processing steps.

Although the invention has been particularly discussed in a photolithography system as an exemplary example, the inventive products, methods and systems may be used in other and further contexts, including any applications where it is desired to maintain a desired boiling temperature of a coolant for cooling a motor, such as precision apparatuses (e.g., photography system). Thus, while the invention has been described in terms of its embodiments, those skilled in the art will recognize that the invention can be practiced with modifications within the spirit and scope of the appended claims. Thus, it is intended that all matter contained in the foregoing description or shown in the accompanying drawings shall be interpreted as illustrative rather than limiting, and the invention should be defined only in accordance with the following claims and their equivalents.

What is claimed is:

1. A system for cooling a motor, comprising:
   a temperature adjusting device which adjusts temperature of a heat transfer fluid to approximately boiling temperature;
   a pressure device which adjusts pressure of the heat transfer fluid to maintain the boiling temperature of the heat transfer fluid at a predetermined level such that the boiling temperature remains substantially constant at the predetermined pressure as heat is absorbed by the heat transfer fluid generated by the motor; and
   a pump which pumps the heat transfer fluid through the temperature adjusting device, the pressure device and the motor.

2. The system of claim 1, wherein the pressure device is a fixed aperture device.

3. The system of claim 2, wherein the fixed aperture device is a one of a venturi and orifice.

4. The system of claim 2, further comprising an atmospheric vent.

5. The system of claim 1 wherein the pressure device is an adjustable pressure valve.

6. The system of claim 5, wherein the adjustable pressure valve is actively controlled to maintain the predetermined pressure to ensure the heat transfer fluid temperature remains at approximately the boiling temperature as it passes through the motor.

7. The system of claim 5, wherein the adjustable pressure valve is one of a pressure regulator and restrictor both adapted to change the pressure and thereby the boiling temperature of the heat transfer fluid.

8. The system of claim 1, further comprising a temperature feedback loop which monitors and adjusts the temperature of the heat transfer fluid via the temperature adjusting device such that a $T_{desired}$ temperature is substantially equal to a $T_{in}$ temperature entering the motor.

9. The system of claim 1, further comprising a pressure feedback control device which adjusts the pressure of the heat transfer fluid via the pressure device such that the boiling temperature of the heat transfer fluid is maintained at a $T_{desired}$ temperature.

10. The system of claim 1, further comprising:
    a temperature feedback loop which monitors and adjusts the temperature of the heat transfer fluid via the temperature adjusting device such that a $T_{desired}$ temperature is substantially equal to a $T_{in}$ temperature; and
    a pressure feedback control device which monitors and adjusts the pressure of the heat transfer fluid via the pressure device such that the boiling temperature of the heat transfer fluid is maintained at a $T_{out}$ temperature which is substantially equal to the $T_{desired}$ temperature.

11. The system of claim 10, further comprising a controller that compares the $T_{out}$ temperature to the $T_{desired}$ temperature and the $T_{desired}$ temperature to the $T_{in}$ temperature to ensure that the temperature of the heat transfer fluid remains approximately constant and boiling of the heat transfer fluid occurs.

12. The system of claim 1, wherein the pump provides an increase in the pressure of the heat transfer fluid and the pressure device provides a pressure drop of the heat transfer fluid prior to entering the motor.

13. The system of claim 1, further comprising an accumulator and attached valve, where the pressurized heat transfer fluid collects in the accumulator and the attached valve drops the pressure as the heat transfer fluid flows toward the pressure device.

14. The system of claim 1, further comprising a valve used to drop the pressure to atmospheric and a reservoir vented to atmosphere.

15. The system of claim 14, wherein the reservoir includes the temperature adjusting device.

16. The system of claim 1, further comprising a condenser which is downstream from the motor and which is adapted to remove heat generated from the motor from the heat transfer fluid.

17. The system of claim 1, further comprising a valve at an exit side of the motor which drops the pressure of the heat transfer fluid to atmospheric and a vented reservoir provided at atmospheric pressure.

18. The system of claim 1, wherein the heat transfer fluid is a coolant that has a boiling temperature at atmospheric pressure above room temperature.

19. The system of claim 1, wherein the heat transfer fluid is a coolant that has a boiling temperature less than ambient temperature at atmospheric pressure.

20. A system for cooling a linear motor, comprising:
    a thermoelectric device adjusting a temperature of a coolant to a boiling temperature of the coolant;
    an adjustable pressure regulating device adjusting a pressure of the heat transfer fluid to maintain the boiling temperature at a predetermined level for the coolant; and
    a feedback control unit which:
       adjusts the temperature of the coolant via the thermoelectric device such that a $T_{desired}$ temperature is substantially equal to a $T_{in}$ temperature; and
       adjusts the pressure of the coolant via the adjustable pressure regulating device such that the boiling temperature of the coolant is maintained at a $T_{out}$ temperature which is substantially equal to the $T_{desired}$ temperature, wherein the adjustable pressure regulating device maintains the boiling temperature of the coolant as heat is absorbed by the coolant generated from the linear motor.

21. The system of claim 20, further comprising an accumulator and attached valve, the accumulator collects the pressurized coolant and attached valve drops the pressure of the coolant.

22. The system of claim 20, further comprising a coarse valve used to drop the pressure of the coolant to atmospheric and a reservoir downstream from the coarse valve vented to atmosphere, where the reservoir is adapted to include the thermoelectric device.

23. The system of claim 20, further comprising a valve downstream from the linear motor which drops the pressure of the coolant back to atmospheric and a vented reservoir.

24. The system of claim 23, wherein the coolant is a fluid that at atmospheric pressure boils below room temperature.

25. The system of claim 20, further comprising a condenser which removes heat from the heated coolant.

26. A method of cooling a motor, comprising the steps of
adjusting the temperature of a heat transfer fluid to approximately boiling temperature;
adjusting a pressure of the heat transfer fluid to maintain the boiling temperature of the heat transfer fluid at a predetermined pressure such that the boiling temperature remains substantially constant as heat is absorbed by the heat transfer fluid generated by the motor;
pumping the heat transfer fluid through the motor at the adjusted temperature and predetermined pressure; and
venting the heat transfer fluid to atmospheric pressure after the pumping step.

27. The method of claim 26, further comprising actively controlling the pressure of the heat transfer fluid to maintain the predetermined pressure to ensure the heat transfer fluid temperature remains at approximately the desired boiling temperature as it passes through the motor.

28. The method of claim 26, further comprising the step of providing a feed back which:

(i) monitors and adjusts the temperature of the heat transfer fluid such that a $T_{desired}$ temperature is substantially equal to a $T_{in}$ temperature entering the motor; and
(ii) monitors and adjusts the pressure of the heat transfer fluid such that the boiling temperature of the heat transfer fluid is maintained at the $T_{desired}$ temperature which is substantially equal to a $T_{out}$ temperature.

29. The method of claim 28, further comprising the step of comparing the $T_{out}$ temperature to the $T_{desired}$ temperature and the $T_{desired}$ temperature to the $T_{in}$ temperature to ensure that the temperature of the heat transfer fluid remains substantially constant and boiling of the heat transfer fluid occurs.

30. A method of cooling a motor, comprising the steps of:
adjusting the temperature of a heat transfer fluid to approximately boiling temperature;
adjusting a pressure of the heat transfer fluid to maintain the boiling temperature of the heat transfer fluid at a predetermined pressure such that the boiling temperature remains substantially constant as heat is absorbed by the heat transfer fluid generated by the motor;
providing a feedback which:
(i) monitors and adjusts the temperature of the heat transfer fluid such that a $T_{desired}$ temperature is substantially equal to a $T_{in}$ temperature entering the motor; and
(ii) monitors and adjusts the pressure of the heat transfer fluid such that the boiling temperature of the heat transfer fluid is maintained at the $T_{desired}$ temperature which is substantially equal to a $T_{out}$ temperature; and
comparing the $T_{out}$ temperature to the $T_{desired}$ temperature and the $T_{desired}$ temperature to the $T_{in}$ temperature to ensure that the temperature of the heat transfer fluid remains substantially constant and boiling of the heat transfer fluid occurs.

* * * * *

UNITED STATES PATENT AND TRADEMARK OFFICE
CERTIFICATE OF CORRECTION

PATENT NO. : 7,288,864 B2
APPLICATION NO. : 10/813258
DATED : October 30, 2007
INVENTOR(S) : J. Eaton et al.

It is certified that error appears in the above-identified patent and that said Letters Patent is hereby corrected as shown below:

Column 11, line 54 (claim 5, line 1) of the printed patent, after "claim 1" insert -- , --.

Signed and Sealed this

Twenty-ninth Day of July, 2008

JON W. DUDAS
*Director of the United States Patent and Trademark Office*